United States Patent [19]

Lin et al.

[11] Patent Number: 5,774,252
[45] Date of Patent: Jun. 30, 1998

[54] MEMBRANE DEVICE WITH RECESSED ELECTRODES AND METHOD OF MAKING

[75] Inventors: Tsen-Hwang Lin; Gregory A. Magel, both of Dallas; Wen R. Wu; Robert M. Boysel, both of Plano, all of Tex.

[73] Assignee: Texas Instruments Incorporated, Dallas, Tex.

[21] Appl. No.: 635,055

[22] Filed: Apr. 19, 1996

Related U.S. Application Data

[63] Continuation of Ser. No. 178,956, Jan. 7, 1994.

[51] Int. Cl.$^6$ .............................. G02B 26/08; G02B 6/26; H01L 27/14; H01L 29/82
[52] U.S. Cl. .......................... 359/224; 359/295; 359/900; 257/414; 257/415; 385/16; 385/40; 385/50
[58] Field of Search ..................................... 359/224, 231, 359/232, 291, 295, 298, 302, 247, 846, 847, 222, 223, 578, 900; 385/18, 40, 47, 16, 50; 257/414, 415, 419

[56] References Cited

U.S. PATENT DOCUMENTS

| | | | |
|---|---|---|---|
| 4,113,360 | 9/1978 | Baur et al. ............................... | 359/222 |
| 4,441,791 | 4/1984 | Hornbeck ................................ | 359/295 |
| 4,862,124 | 8/1989 | Rando ..................................... | 385/16 |
| 5,158,506 | 10/1992 | McDonald ............................... | 385/16 |
| 5,178,728 | 1/1993 | Boysel et al. ........................... | 156/656 |
| 5,223,971 | 6/1993 | Magel ..................................... | 359/295 |
| 5,231,153 | 7/1993 | Magel et al. ........................... | 359/295 |
| 5,311,360 | 5/1994 | Bloom et al. ........................... | 359/224 |
| 5,367,585 | 11/1994 | Ghezzo et al. ......................... | 385/40 |

*Primary Examiner*—Paul M. Dzierzynski
*Assistant Examiner*—John Juba, Jr.
*Attorney, Agent, or Firm*—Julie L. Reed; James C. Kesterson; Richard L. Donaldson

[57] ABSTRACT

A membrane device is provided in which a plurality of ridges (14) and recesses (16) are formed proximate to a substrate (12). Electrodes (18) are formed within the recesses (16). A spacer (20) supports a membrane (22). Application of a potential difference between the membrane (22) and the electrodes (18) allows for deflection of the membrane (22) toward the electrodes (18).

15 Claims, 2 Drawing Sheets

MEMBRANE DEVICE WITH RECESSED ELECTRODES AND METHOD OF MAKING

This application is a Continuation of application Ser. No. 08/178,956 filed on Jan. 7, 1994.

NOTICE

The U.S. Government has a paid-up license in this invention and the right in limited circumstances to require the patent owner to license others on reasonable terms as provided for by the terms of contract no. F30602-89-C-0174 awarded by U.S. Air Force Rome Laboratory, Griffiss Air Force Base, Rome, N.Y.

TECHNICAL FIELD OF THE INVENTION

This invention relates generally to membrane devices, and more particularly to a membrane device with recessed electrodes and a method of making the device.

BACKGROUND OF THE INVENTION

Membrane devices are useful in a wide range of applications, including integrated-optic waveguide systems, light beam steering systems, systems that use variable focal length mirrors, three-dimensional display systems, and systems that use spatial light modulators, among other applications.

Generally speaking, a membrane device includes a membrane stretched over an air gap. The membrane may be made of metal or coated on one or both sides with a layer of metal. The air gap separates the membrane from an electrode. When a potential difference is applied between the membrane and the electrode, electrostatic attraction between them pulls the membrane into the air gap. The shape of the membrane is thereby changed, and this change in shape can be exploited in a wide range of applications.

If the electrode is not covered with a dielectric, a layer of metal on the membrane may come into direct contact with the electrode, thereby causing a short between the metal layer and the electrode, resulting in inoperability of the device.

To avoid this problem, electrodes are often buried in or coated with a dielectric. This solves the short circuiting problem, but gives rise to another problem. Once the membrane makes contact with the dielectric, charge is transferred between the membrane and the dielectric. The charge build-up at the dielectric results in slow or inconsistent operation of the device. For example, an application may require that the membrane be pulled down through the air gap and released at a particular frequency. The charge build-up on the dielectric will interfere with the electrostatic attraction between the electrode and the membrane, thereby affecting the device's speed or consistent operation. For consistent operation, the charge on the dielectric must be allowed to bleed off before trying to cycle the membrane. This bleed off time dictates the speed of the device.

SUMMARY OF THE INVENTION

Therefore, a need has arisen for a membrane device that allows for faster operation by allowing for faster charge bleed off from the dielectric that isolates the electrode or electrodes from the membrane. Furthermore, in integrated optic waveguide applications, a need has arisen for a structure that allows a membrane to directly contact a waveguide.

In accordance with the present invention, a membrane device with recessed electrodes is provided which substantially eliminates or reduces disadvantages and problems associated with prior art membrane devices.

In particular, a membrane device, and method of forming it, is provided in which a substrate is formed with a plurality of recesses proximate the substrate. A plurality of electrodes are then formed within the recesses. A spacer layer is formed above the electrodes, with a membrane formed above the spacer layer. At least some of the spacer layer is removed with a selective etch. The membrane is, therefore, capable of deflection toward the electrodes upon application of a potential difference between the electrodes and the membrane.

An important technical advantage of the present invention is the fact that the total area of contact between the membrane and the underlying dielectric is reduced. This reduction in contact area reduces the probability that the membrane will stick to the underlying dielectric. Moreover, foreign particles, which can give rise to problems such as bumpiness in a deflected membrane, will be less problematic since many will fall into the recesses.

Another important technical advantage of the present invention is that the short surface path from the underlying dielectric to the electrodes will cause any charge transferred between the membrane and the underlying dielectric to bleed off more quickly than prior art devices.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF THE INVENTION

Figure 1:
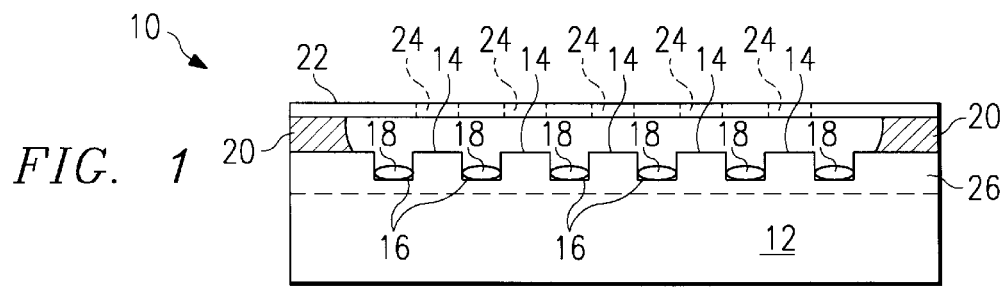
FIG. 1 illustrates a side view of a membrane device with recessed electrodes constructed according to the teachings of the present invention.

FIG. 1 illustrates a side view of a membrane device 10 with recessed electrodes constructed according to the teachings of the present invention. As shown in FIG. 1, a substrate 12 is formed with a plurality of ridges 14 and recesses 16. This pattern may be formed by patterning and etching the substrate 12. The substrate 12 may be a semiconducting or insulating substrate, such as silicon, gallium arsenide or silicon dioxide, among others. In a particular embodiment, each recess 16 may be one micrometer deep and six micrometers wide. The width of each ridge 14, and therefore the separation of the recesses 16, may be one micrometer.

Electrodes 18 are formed within recesses 16. Electrodes 18 are conductive, and may be formed of a conductor such as aluminum, tungsten, doped polysilicon, or any other conductor. The electrodes 18 may be deposited or formed in the recesses 16 as is generally known in the art. As an example, selective or blanket deposition may be used to form the electrodes 18. After deposition or formation of the electrodes 18, an etch may be performed to prevent shorting of the electrodes 18 across ridges 14. In a particular embodiment, each electrode 18 may be 0.5 micrometers high.

After forming electrodes 18, a spacer layer 20 is formed. The spacer layer 20 may comprise a polymer layer, applied by spinning, and may be on the order of two micrometers thick. Other layers that may be selectively removed may also be used for spacer layer 20, and other thicknesses may also be used. After depositing spacer layer 20, membrane 22 is deposited. Membrane 22 may be deposited by sputtering or evaporation, and may comprise a tensile film of a reflective metal such as gold, aluminum, or an aluminum alloy. Membrane 22 may be on the order of 3000–4000 Angstroms thick, although other thicknesses may also be used. Alternatively, membrane 22 may comprise a dielectric, such as a nitro cellulose polymer, silicon nitride or silicon dioxide, coated on one or both sides with a thin layer of metal, such as gold, aluminum, or an aluminum alloy.

After the membrane 22 is deposited, it is patterned and etched to form access holes (or slots) 24. An isotropic selective etch, such as a plasma etch, is then used to remove the spacer layer 20 over the electrodes 18 and underlying membrane 22. The etchant has access to the spacer layer 20 through the holes 24. FIG. 1 illustrates spacer layer 20 after it has been etched. As an alternative, a selective wet chemical etch can be used to remove spacer layer 20. Such an etchant can be introduced through an access in the same plane as the spacer layer 20, or through the membrane 22, for example. Thus, the access holes 24 are not needed with such an etch.

The ridges 14 and recesses 16 may also be formed in a dielectric layer separate from substrate 12 and formed overlying substrate 12. This separate dielectric layer is shown in dashed line form in FIG. 1 as layer 26. Dielectric layer 26 may be formed of, for example, silicon dioxide or silicon nitride. Typically, layer 26 would be included when a semiconducting substrate 12 is used.

The holes 24 shown in FIG. 1 are exemplary only, and other holes, with different sizes and shapes, may be used without departing from the intended scope of the present invention. Similarly, membrane 22 is not limited to any one shape. Nor must it be supported by spacer 20 on all sides or around its entire perimeter. The size and support for membrane 22 are factors which affect the shape of its deformation. Moreover, membrane 22 may be the deformable member of any one of many deformable mirror devices (DMDs), such as flexure beam DMDs. The term membrane will refer to any such member. Furthermore, although FIG. 1 illustrates only one device 10, a number of devices 10 may be assembled together to form an array.

It should be understood that the layout pattern and number of ridges 14, recesses 16, and electrodes 18 shown in FIG. 1 is exemplary only, and different patterns and different numbers of electrodes may be used without departing from the intended scope of the present invention. For example, patterns may be used that allow for other than straight lines, such as arrayed or concentric patterns. Furthermore, the shapes of the ridges 14 may be changed, for example, so that a cross-section of a ridge is triangular, without departing from the intended scope of the present invention.

Figure 2:
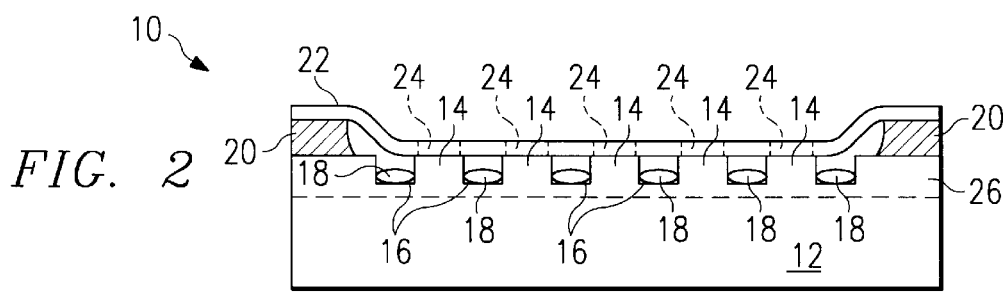
FIG. 2 illustrates an example of a membrane device constructed according to the present invention with a deflected membrane.

FIG. 2 illustrates a particular embodiment of the present invention in which a potential difference applied between the electrodes 18 and membrane 22 causes the membrane 22 to be deflected down towards the electrodes 18. As can be seen from FIG. 2, the membrane 22 makes contact with ridges 14, and not electrodes 18. Therefore, there is no short circuiting problem. Furthermore, because of the recesses 16, the total area of contact between membrane 22 and the underlying dielectric is reduced. This reduction in contact area reduces the probability that the membrane 22 will stick to the underlying dielectric. Moreover, foreign particles, which can give rise to problems such as bumpiness in a deflected membrane, will be less problematic since many will fall into the recesses 16. Furthermore, any charge transferred between the membrane 22 and the ridges 14 will bleed off more quickly than prior art devices because of the short surface path between ridges 14 and the electrodes 18. In particular, any charge transferred to the ridges 14 will bleed off to the electrodes 18.

Figure 3:
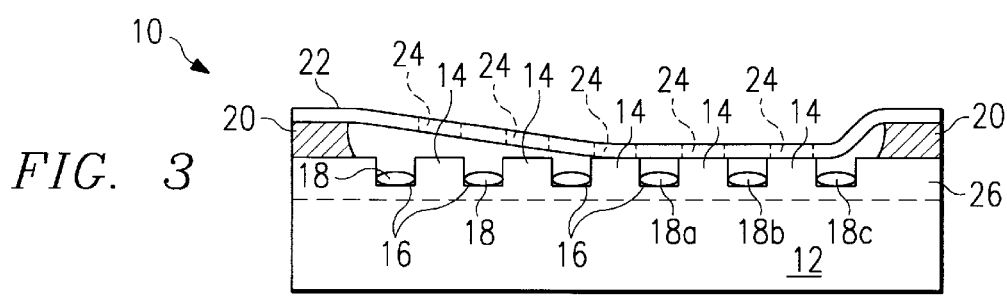
FIG. 3 illustrates another example of a membrane device constructed according to the teachings of the present invention with a deflected membrane.

FIG. 3 illustrates another example of a cross section of a device constructed according to the teachings of the present invention with membrane 22 deflected. As shown in FIG. 3, only certain of the electrodes, as shown in FIG. 3, electrodes 18*a*, 18*b*, and 18*c*, are energized, thereby causing membrane 22 to be pulled down only above these electrodes. As can be seen from FIG. 3, the present invention allows for separately and independently addressable electrodes. It should be understood that in some applications the electrodes 18 will be energized such that the membrane 22 will be deflected, but not deflected so far as to come into contact with the ridges 14.

Figure 4:
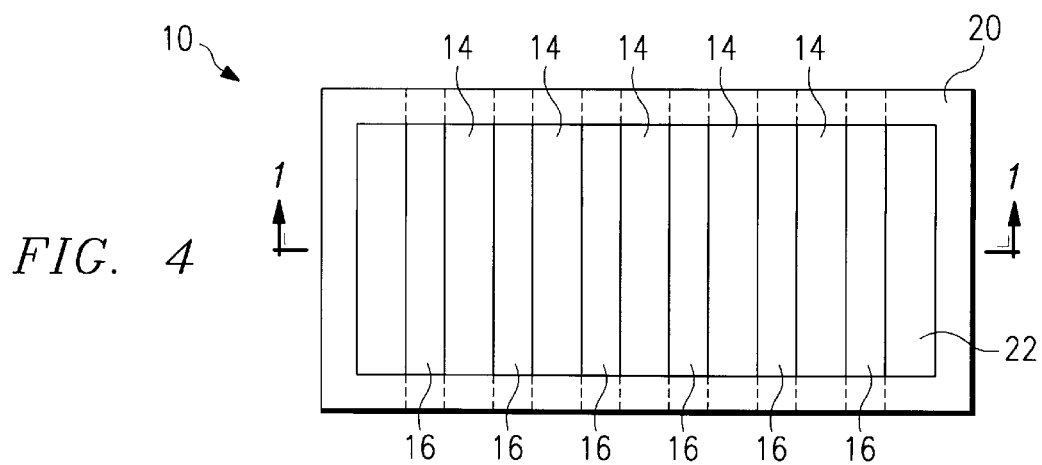
FIG. 4 illustrates a top view of a membrane device constructed according to the teachings of the present invention.

FIG. 4 illustrates a top view of the device 10 shown in FIG. 1. FIG. 4 is shown with membrane 22 removed. As can be seen in FIG. 4, spacer layer 20 is etched so that it surrounds the perimeter of device 10 to support membrane 22. Ridges 14 and recesses 16 are shown spanning device 10. The electrodes 18 that are within recesses 16 may be separately and independently addressed so as to vary the deformation of membrane 22, for example as shown in FIG. 3.

It should be understood that the particular layout of electrodes 18 shown in FIGS. 1–4 is exemplary only, and other layouts may be used without departing from the intended scope of the present invention. For example, separately addressable electrodes may be used that do not run the length of the device, allowing for complex deflections (deformations) of membrane 22.

A particular application for a membrane device such as that shown in FIGS. 1–4 is for use as a switchable resonant filter for optical radiation, as described in U.S. Pat. No. 5,231,532, issued on Jul. 27, 1993, and assigned to Texas Instruments Incorporated (the '532 Patent). That patent is herein incorporated by reference. As described in that patent, the holes (or slots) 24 may be formed of a specified length or shape in order to resonate with radiation of a particular wavelength. When the underlying electrodes are activated, the membrane deflects and its varying proximity to the substrate changes the wavelength of transmission through the device, thereby providing the filter function. With such a device, the radiation passes through the substrate 12 and then through the membrane 22. Thus, the substrate should be transparent to the particular wavelength of radiation. For example, for radiation in the 8–12 micron wavelength band, a substrate such as silicon or gallium arsenide could be used. The electrodes should also be transparent, and may be formed of a transparent conductor such as indium tin oxide. Moreover, the electrodes may be widely spaced so that even if they are not transparent, the device is still generally transparent to the wavelength of radiation of interest. The '532 Patent also discusses techniques for fabricating such devices that are generally applicable to the present invention.

Another application for the device 10 shown in FIGS. 1–4 is that of a light beam steering device, as described generally in U.S. Pat. No. 5,223,971, issued Jun. 29, 1993, and assigned to Texas Instruments Incorporated. That patent is herein incorporated by reference. In beam-steering applications, deformation of the membrane 22 results in redirection of light beams. Beam-steering has found applications in optical processing, optical memories, and laser scanning such as for laser printing, among others.

Another application for devices constructed according to the present invention includes spatial light modulator systems, such as projection display systems, wherein, depending on the shape of the membrane, light is either reflected onto or away from a projection screen. Another application includes use as a varying focal length mirror, such as those used in infrared systems, wherein the shape of the mirror determines its focal length, thus allowing for both calibration and imaging.

Figure 5:
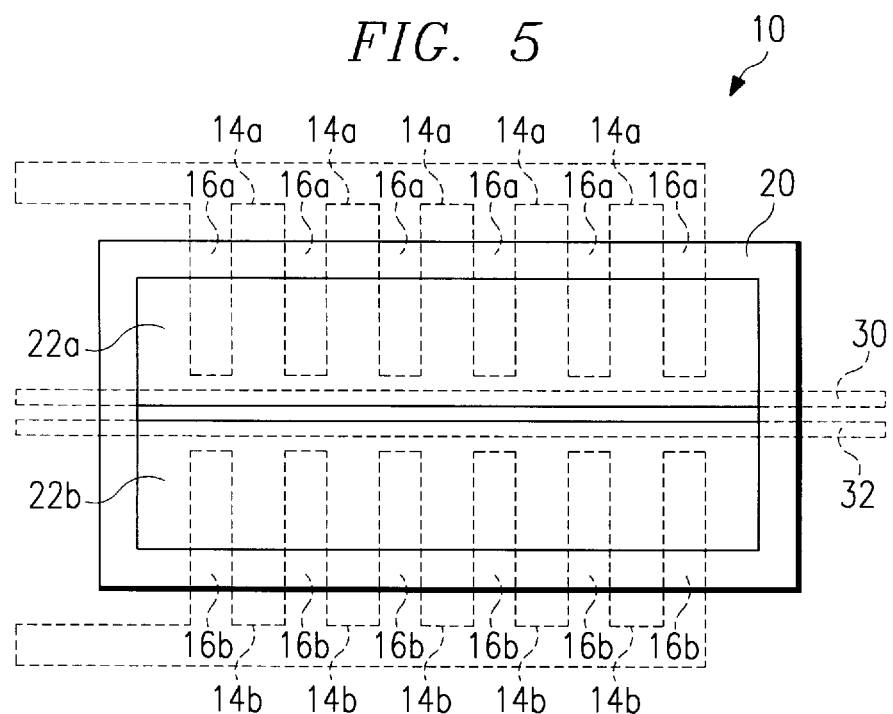
FIG. 5 illustrates a top view of a particular embodiment of the present invention for use in a integrated optic waveguide system.

Still another application of the present invention is that of integrated optic waveguide devices, as discussed in connection with FIGS. 5 and 6. FIG. 5 illustrates a top view of an embodiment of the present invention for use with such integrated optic waveguide systems. As shown in FIG. 5, two sets of recesses 16a and 16b, in which sets of electrodes 18a and 18b are formed, are provided. Each set extends less than halfway across the device. Each set of electrodes controls one of two membranes, as shown in FIG. 5, membranes 22a and 22b.

Waveguides 30 and 32 are formed proximate the surface of the underlying substrate 12 (or the separate dielectric layer 26) between the two sets of recesses 16a and 16b. Specific materials and techniques for forming the waveguides are discussed in U.S. Pat. No. 5,178,728 issued Jan. 12, 1993, and assigned to Texas Instruments Incorporated (the '728 Patent), which is herein incorporated by reference. Each of the waveguides 30 and 32 is formed below a respective membrane 22a and 22b. Thus, as membrane 22a is deflected downward, it will be brought into proximity with waveguide 30, thereby changing the transmission characteristics of waveguide 30. In particular, as described in the '728 Patent, as the membrane contacts the waveguide, radiation being transmitted through the waveguide may be switched off. Similarly, membrane 22b may be brought into proximity with waveguide 32 by energizing the appropriate electrodes 18b.

Because the electrodes 18 are recessed, waveguides may be formed at the surface of the substrate 12 or layer 26, thereby allowing the membrane 22 to come into very close proximity with, including touching, the waveguide.

With the device shown in FIG. 5, the coupling between the two waveguides may be controlled by actuating either membrane 22a or 22b. However, a single waveguide or a multiplicity of waveguides may also be constructed such that one or more membranes may be used to contact or otherwise control them as described above. Similarly, many different electrode layouts may be used as well. Furthermore, as described in the '728 Patent, a wide range of waveguide geometries and membrane geometries may be fabricated to create various integrated optic waveguide devices. The recessed electrodes described above may be used in any of these various applications.

Figure 6:
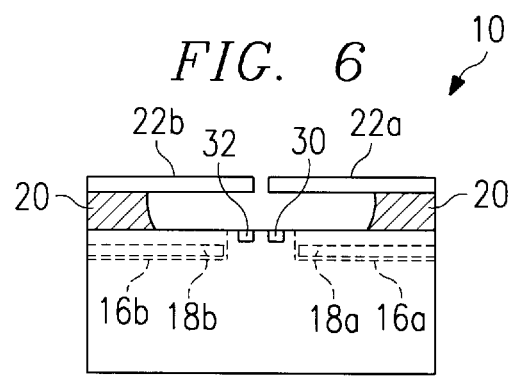
FIG. 6 illustrates a side view of a particular embodiment of the present invention for use in an integrated optic waveguide system.

FIG. 6 illustrates a side view of the device shown in FIG. 5. As shown in this side view, electrodes 18a control membrane 22a such that it may be deflected into contact or close proximity with waveguide 30. Likewise, electrodes 18b control membrane 22b, such that it may be deflected and brought into contact or close proximity with waveguide 32.

It should be understood that materials and dimensions used in this description are exemplary only, and other materials and dimensions may be used without departing from the intended scope of the present invention.

In summary, membrane devices are disclosed which use recessed electrodes to prevent shorting and to increase their speed and consistent operation. With recessed electrodes, no short circuiting occurs, but charge transferred between the membrane and an underlying dielectric is quickly bled off, thereby resulting in faster and more consistent operation.

Although the present invention has been described in detail, it should be understood that various changes, substitutions, and alterations can be made without departing from the spirit and scope of the invention as defined by the appended claims.

What is claimed is:

1. A membrane device, comprising:
    a substantially flat substrate having a top surface and a plurality of recesses formed into the surface of said substrate such that said recesses lie below said top surface of said substrate;
    a plurality of electrodes formed within said recesses;
    a spacer upon said top surface of said substrate;
    an electrostatically deformable membrane above said electrodes and supported by said spacer, wherein said membrane deflects toward said electrodes upon application of a potential difference between said electrodes and said membrane; and
    slots in said membrane, said slots being resonant for optical radiation of a predetermined wavelength.

2. The device of claim 1, wherein said substrate comprises a base layer and a dielectric layer, said recesses being formed in an upper surface of said dielectric layer.

3. The device of claim 1, wherein said electrodes are separately addressable, such that said membrane is capable of deflection toward selected electrodes.

4. The device of claim 1, wherein said substrate is substantially transparent to the predetermined wavelength.

5. The device of claim 1, wherein said electrodes are substantially transparent to the predetermined wavelength.

6. The device of claim 1, wherein said electrodes are spaced far enough apart such that said electrodes do not substantially interfere with the transmission of said optical radiation.

7. The device of claim 1, wherein said recesses are formed parallel to each other.

8. An integrated optic device, comprising:
    a substrate having a plurality of recesses formed into a surface of said substrate;
    a plurality of electrodes formed within said recesses;
    a first waveguide formed on said surface of said substrate;
    a spacer; and
    a first electrostatically deformable membrane above said electrodes and supported by said spacer, said first membrane operable to deflect toward said electrodes and said first waveguide upon application of a potential difference between said electrodes and said first membrane.

9. The substrate of claim 8 further comprising a dielectric layer said recesses and first waveguide being formed on said upper surface of said dielectric layer.

10. The device of claim 8, wherein said electrodes are separately addressable, such that said first membrane is capable of deflection toward selected electrodes.

11. The device of claim 8, and further comprising:
 a second waveguide formed on said surface of said substrate; and
 a second electrostatically deformable membrane above said electrodes and supported by said spacer, such that said first and second membranes are operable to deflect toward said first and second waveguides, respectively, upon application of a potential difference between selected electrodes and said first and second membranes.

12. A method of forming a membrane device, comprising the steps of:
 forming a substrate;
 forming a plurality of recesses in a surface of said substrate;
 forming a plurality of electrodes within the recesses;
 forming a spacer;
 forming an electrostatically deformable membrane above the spacer;
 patterning the membrane with an array of access holes; and
 selectively removing at least some of the spacer.

13. The method of claim 12, wherein said step of selectively removing comprises removing at least some of the spacer with a selective wet etch.

14. The forming a substrate step of claim 12 further comprising forming a dielectric layer as part of the substrate, the recesses being formed at an upper surface of the dielectric layer.

15. The method of claim 12, and further comprising the step of forming a waveguide on the surface of the substrate, the membrane operable to deflect toward the waveguide upon application of a potential difference between the electrodes and the first membrane.

* * * * *

UNITED STATES PATENT AND TRADEMARK OFFICE
CERTIFICATE OF CORRECTION

PATENT NO. : 5,774,252
DATED : 6/30/98
INVENTOR(S) : Tsen-Hwang Lin, Gregory A. Magel, Robert M. Boysel, Wen R. Wu It is certified that error appears in the above-indentified patent and that said Letters Patent is hereby corrected as shown below:

Column 1, delete lines 8-13 and insert the following:

The U.S. Government has a paid-up license in
this invention and the right in limited circumstances
to require the patent owner to license others on
reasonable terms as provided for by the terms of
contract no. F30602-91-C-0008 awarded by U.S. Air
Force Rome Laboratory, Griffiss Air Force Base,
Rome, New York.--

Signed and Sealed this

Twenty-fourth Day of November,1998

Attest:

BRUCE LEHMAN

*Attesting Officer*    Commissioner of Patents and Trademarks